(12) United States Patent
Lenchenkov (10) Patent No.: US 8,330,840 B2
(45) Date of Patent: Dec. 11, 2012

(54) IMAGE SENSOR WITH MULTILAYER INTERFERENCE FILTERS

(75) Inventor: Victor Lenchenkov, Sunnyvale, CA (US)

(73) Assignee: Aptina Imaging Corporation, George Town (KY)

( * ) Notice: Subject to any disclaimer, the term of this patent is extended or adjusted under 35 U.S.C. 154(b) by 379 days.

(21) Appl. No.: 12/537,128

(22) Filed: Aug. 6, 2009

(65) Prior Publication Data

US 2011/0032398 A1 Feb. 10, 2011

(51) Int. Cl.
*H04N 5/335* (2006.01)
(52) U.S. Cl. ......... 348/294; 348/273; 348/335; 348/340
(58) Field of Classification Search ................... 348/273
See application file for complete search history.

(56) References Cited

U.S. PATENT DOCUMENTS

| | | | |
|---|---|---|---|
| 3,682,528 A | 8/1972 | Apfel et al. | |
| 5,246,803 A | 9/1993 | Hanrahan et al. | |
| 5,790,188 A | 8/1998 | Sun | |
| 6,638,668 B2 | 10/2003 | Buchsbaum et al. | |
| 7,061,028 B2* | 6/2006 | Yaung et al. | 257/208 |
| 7,728,278 B2* | 6/2010 | Roy et al. | 250/214.1 |
| 8,035,710 B2* | 10/2011 | Koyama | 348/273 |
| 2002/0102498 A1* | 8/2002 | Hsin | 430/321 |
| 2004/0104663 A1* | 6/2004 | Umeya et al. | 313/461 |
| 2004/0165095 A1* | 8/2004 | Shimizu et al. | 348/335 |
| 2005/0045927 A1* | 3/2005 | Li | 257/294 |
| 2005/0103983 A1* | 5/2005 | Yamaguchi et al. | 250/214.1 |
| 2005/0127463 A1* | 6/2005 | Yaung et al. | 257/443 |
| 2005/0174664 A1* | 8/2005 | Ito et al. | 359/883 |
| 2006/0113622 A1* | 6/2006 | Adkisson et al. | 257/443 |
| 2006/0124833 A1* | 6/2006 | Toda | 250/214 R |
| 2006/0163451 A1* | 7/2006 | Park et al. | 250/208.1 |
| 2006/0164720 A1* | 7/2006 | Yoshida et al. | 359/359 |
| 2006/0169878 A1* | 8/2006 | Kasano et al. | 250/226 |
| 2006/0172451 A1* | 8/2006 | Park | 438/57 |
| 2006/0183265 A1* | 8/2006 | Oh et al. | 438/65 |
| 2006/0205107 A1* | 9/2006 | Inaba et al. | 438/57 |
| 2006/0261280 A1* | 11/2006 | Oon et al. | 250/370.08 |
| 2006/0285005 A1* | 12/2006 | Inaba et al. | 348/340 |
| 2007/0023799 A1* | 2/2007 | Boettiger | 257/292 |
| 2007/0051876 A1* | 3/2007 | Sumi et al. | 250/214 R |
| 2007/0076105 A1* | 4/2007 | Inokuma | 348/273 |
| 2007/0114622 A1* | 5/2007 | Adkisson et al. | 257/414 |
| 2007/0127126 A1* | 6/2007 | Terada | 359/586 |
| 2007/0161146 A1* | 7/2007 | Lee | 438/70 |

(Continued)

FOREIGN PATENT DOCUMENTS

JP 2000-180621 * 6/2000

*Primary Examiner* — Nicholas Giles
*Assistant Examiner* — Abdelaaziz Tissire
(74) *Attorney, Agent, or Firm* — Treyz Law Group; Jason Tsai (57) ABSTRACT

Image sensors are provided for electronic imaging devices. An image sensor can be formed from an array of image pixels. Bragg-type multilayer interference filters can be formed for the image sensor using dielectric layers with alternating high and low indices of refraction. The multilayer interference filters can be configured to form band-pass filters of desired colors and infrared-blocking filters. Dielectric layers with non-flat bulk absorption properties may be used to tune the absorption of the filters. The interference filters may be provided in a uniform pattern so that an image sensor exhibits a monochrome response or may be arranged in a multicolor color filter array pattern such as a Bayer pattern.

19 Claims, 9 Drawing Sheets

U.S. PATENT DOCUMENTS

| | | | |
|---|---|---|---|
| 2007/0200054 A1* | 8/2007 | Reznik et al. | 250/208.1 |
| 2008/0087921 A1* | 4/2008 | Yu et al. | 257/213 |
| 2008/0090323 A1* | 4/2008 | Wu | 438/70 |
| 2008/0108170 A1* | 5/2008 | Adkisson et al. | 438/70 |
| 2008/0116537 A1* | 5/2008 | Adkisson et al. | 257/448 |
| 2008/0303108 A1* | 12/2008 | Kasano et al. | 257/432 |
| 2008/0304156 A1* | 12/2008 | Koyama | 359/588 |
| 2008/0315339 A1* | 12/2008 | Rennie | 257/432 |
| 2009/0152664 A1* | 6/2009 | Klem et al. | 257/440 |
| 2009/0159944 A1* | 6/2009 | Oh | 257/292 |
| 2009/0160983 A1* | 6/2009 | Lenchenkov | 348/294 |
| 2009/0200452 A1* | 8/2009 | Venezia et al. | 250/208.1 |
| 2009/0225204 A1* | 9/2009 | Inaba et al. | 348/273 |
| 2009/0273046 A1* | 11/2009 | Inaba et al. | 257/432 |
| 2009/0315131 A1* | 12/2009 | Hung et al. | 257/432 |
| 2009/0321865 A1* | 12/2009 | Kasano et al. | 257/432 |
| 2009/0323060 A1* | 12/2009 | Knipp | 356/327 |
| 2010/0073540 A1* | 3/2010 | Wells et al. | 348/308 |
| 2010/0308427 A1* | 12/2010 | Lenchenkov | 257/432 |
| 2011/0032398 A1* | 2/2011 | Lenchenkov | 348/294 |

* cited by examiner

IMAGE SENSOR WITH MULTILAYER INTERFERENCE FILTERS

BACKGROUND

The present invention relates to image sensors, and more specifically, to image sensors with multilayer interference filters.

Image sensors are commonly used in electronic devices such as cellular telephones, computers, and digital cameras.

A conventional image sensor is formed at two separate fabrication plants. The conventional image sensor is initially processed at a plant that uses complementary metal-oxide-semiconductor (CMOS) transistor fabrication techniques. The conventional image sensor is then sent to a color filter array (CFA) plant.

At the CMOS plant, photodiodes that convert light into electrical signals are manufactured in a silicon substrate. Interconnect layers used for wiring transistors are fabricated on top of the photodiodes and the substrate. Above the interconnect layers, a passivation layer that insulates the transistors and interconnect layers from external contamination is then deposited. When the CMOS process is complete, the conventional image sensor is transferred to the CFA plant for additional processing.

At the CFA plant, a color filter array is formed on top of the passivation layer. The color filter array includes tiles incorporating various colored dyes for color filtering. An example of a CFA pattern that may be used is the GRBG (green-red-blue-green) Bayer pattern. After the color filter array is in place, an array of microlenses is formed on top of the color filter array.

A disadvantage of a conventional image sensor of this type is that the image sensor requires manufacturing processes that are implemented at two separate fabrication plants. This requirement can increase processing complexity and cost. Conventional image sensors may also be prone to contamination from the dye of the color filter array, which results in loss of efficiency, sensitivity, and reliability. It would therefore be desirable to be able to provide improved image sensors.

DETAILED DESCRIPTION

This relates to image sensors with multilayer interference filters. An image sensor can be used with any type of electronic device used for imaging, such as a digital camera, a cellular telephone, medical equipment, a computer, or any other imaging device.

Figure 1:
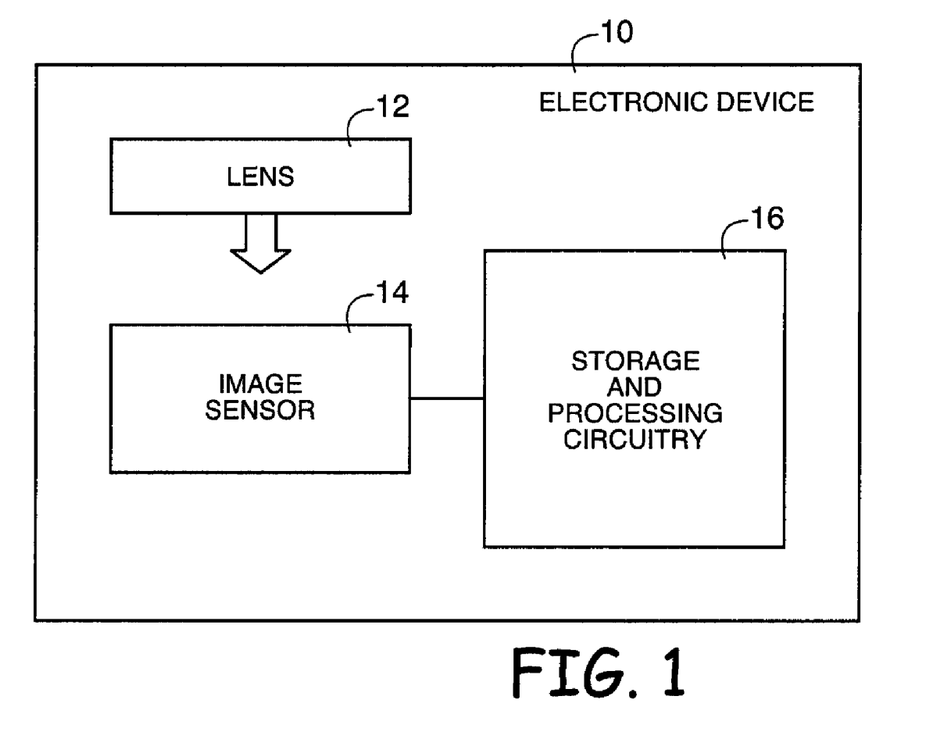
FIG. 1 is a diagram of an electronic device in accordance with an embodiment of the present invention.

A high-level block diagram for such an electronic device is shown in FIG. 1. Electronic device 10 may include lens 12, image sensor 14, and storage and processing circuitry 16. Lens 12 may be used to focus light onto image sensor 14. Image sensor 14 has an array of image pixels with which sensor 14 generates data corresponding to an image. Image data can be stored at storage and processing circuitry 16 for future retrieval. Storage and processing circuitry 16 may include circuitry that controls image sensor 14 and circuitry that implements other functions for electronic device 10.

Figure 2:
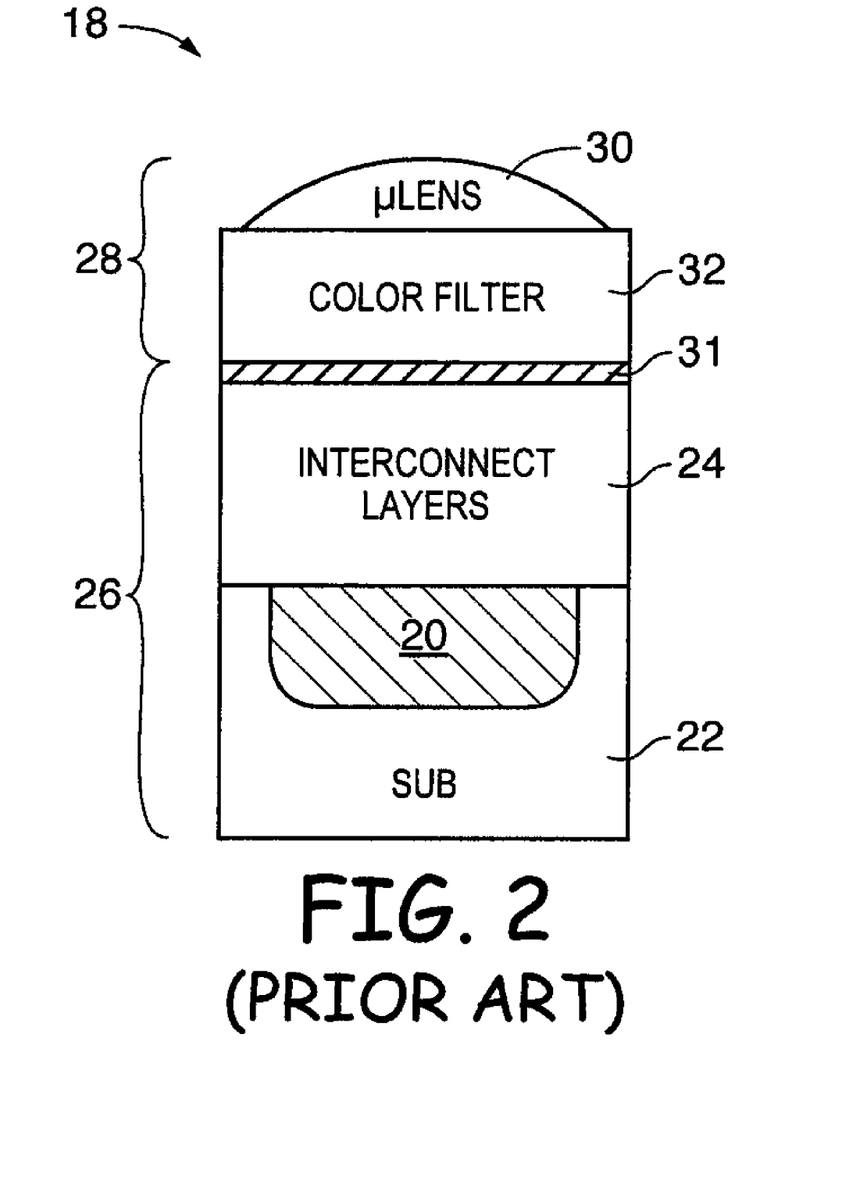
FIG. 2 is a cross-sectional side view of a conventional image pixel.

The cross-sectional side view of a conventional image pixel 18 is shown in FIG. 2. A photodiode 20 is fabricated in silicon substrate 22. On top of photodiode 20 are interconnect layers 24 that are used to route signals to complementary metal-oxide-semiconductor (CMOS) transistors. On top of interconnect layers 24 is a layer of silicon nitride 31 that is used to insulate the transistors from contamination. Components 20, 22, 24, and 31 form a pixel structure 26 that is manufactured entirely using CMOS technology at a CMOS plant.

Pixel structure 26 is transferred to a color filter array (CFA) plant to attach a color filter array including filter tiles such as color filter 32. Microlens 30 is formed on top of color filter 32. The color filter array includes tiles of various colors for color filtering. Microlens 30 is used to concentrate incoming light onto photodiode 20. Color filter 32 and microlens 30 make up portion 28 of conventional image pixel 18.

Figure 3:
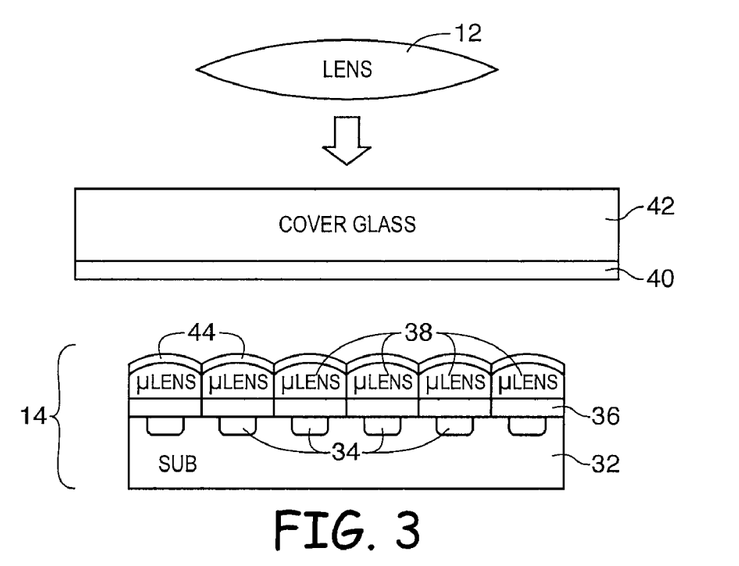
FIG. 3 is a side view of a lens and an image sensor with an optional cover glass and an interference filter in accordance with an embodiment of the present invention.

Details of the image sensor 14 of FIG. 1 are shown in FIG. 3. Light passing through lens 12 can be focused on image sensor 14. Image sensor 14 may include photodiodes 34 formed in a two-dimensional array on a substrate 32. Substrate 32 may be a silicon substrate, germanium substrate, a silicon-on-insulator substrate, or a substrate formed from other elements or combination of elements. Multilayer interference filters 36 may be formed in an array on top of photodiodes 34 and substrate 32. Microlenses 38 can be fabricated on top of interference filters 36. Each microlens 38 can be associated with a respective photodiode 34 and may be used to concentrate incoming light onto that photodiode 34. If desired, an additional multilayer interference filter 44 may be placed on top of microlenses 38 to provide additional color filtering or infrared (IR) blocking capabilities.

An optional transparent layer 42 (sometimes referred to as a cover glass layer) can be placed between lens 12 and image sensor 14. Cover glass 42 may have a filter layer such as filter 40 (e.g., for IR blocking). Cover glass 42 may be packaged with image sensor 14 to form a camera module.

Figure 4:
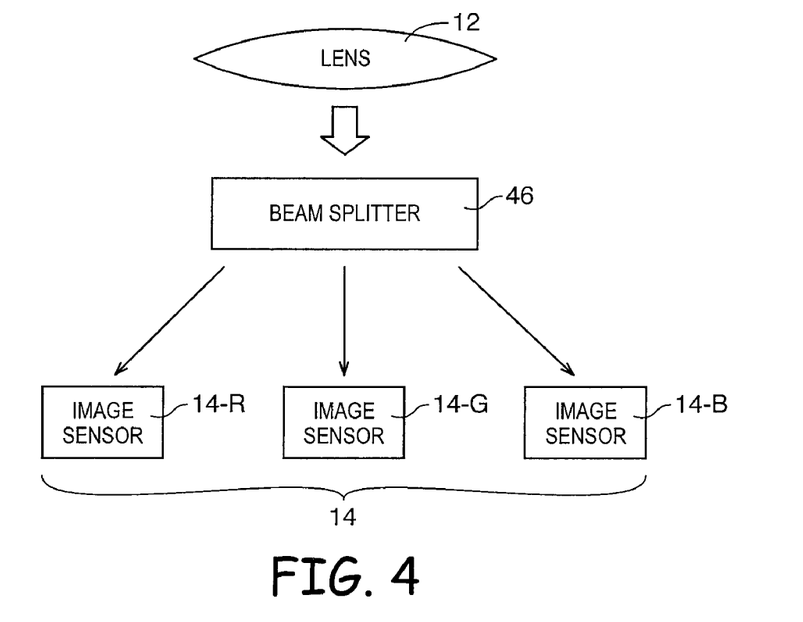
FIG. 4 is a flow diagram showing a lens, beam splitter optics, and three image sensors in accordance with an embodiment of the present invention.

Image sensors such as image sensor 14 may be provided with color filter tiles of various colors. A sensor of this type may form color images. If desired, multiple single-color image sensors can be used together. This type of arrangement is shown in FIG. 4. FIG. 4 shows a system that includes lens 12, beam splitter optics 46, and image sensors 14-R, 14-G, and 14-B. Light passing through lens 12 may be fed to beam splitter optics 46, which can split the light into separate paths. Each light path may correspond to a respective color of incoming light. For example, image sensors 14-R, 14-G, and 14-B may correspond to image sensor arrays containing red, green, and blue pixels, respectively. Image sensors 14 may also include cyan, magenta, and yellow pixels, or pixels of other colors.

Figure 5:
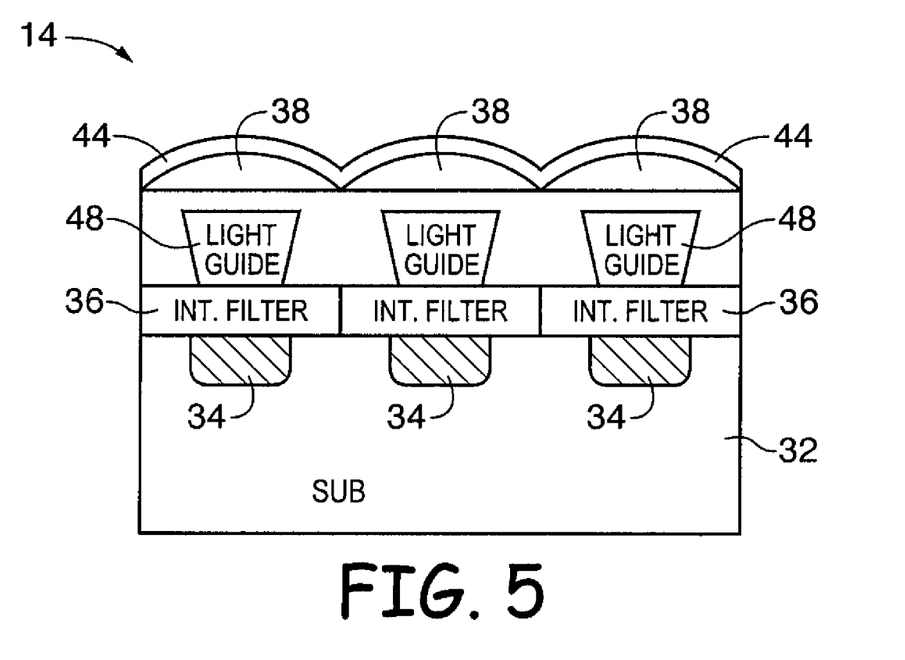
FIG. 5 is a cross-sectional side view of an image sensor in accordance with an embodiment of the present invention.

Image sensor 14 may be provided with an array of optional light guides 48, as shown in FIG. 5. Light guides 48 may be formed between microlenses 38 and interference filters 36. Each light guide 48 may have a higher index of refraction than the dielectric material that surrounds the light guide. Light guides 48 may help provide image sensor 14 with increased tolerance to various angles of incidence for incoming light. Light guides 48 may also help reduce optical cross talk and increase signal levels.

Figure 6:
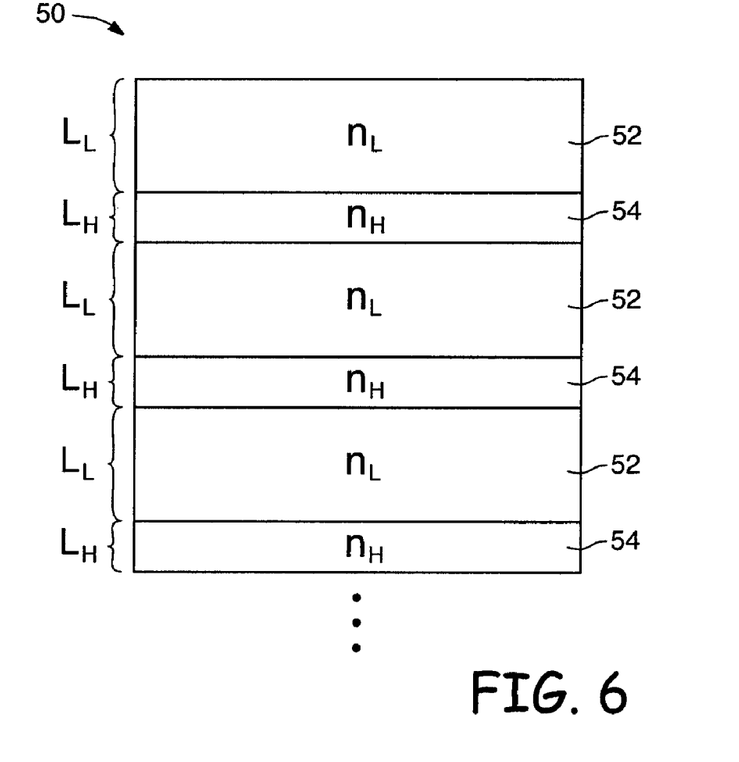
FIG. 6 is a cross-sectional side view of a single-stack multilayer interference filter in accordance with an embodiment of the present invention.

FIG. 6 shows a general structure of a single-stack multi-layer interference filter 50. Interference filter 50 may include several layers of material having alternating high and low indices of refraction. For example, a layer 52 with a low index of refraction may be adjacent to a layer 54 with a higher index of refraction. This pattern may be repeated and optimized to provide desired filtering capabilities (i.e., a Bragg-type filter). The layers of material can be formed from silicon oxide, silicon nitride, silicon carbide, titanium oxide, tin oxide, hafnium oxide, zinc oxide, or other transparent materials.

The ratio of the thicknesses of the alternating layers 52 and 54 is preferably related to the ratio of high and low indices of refraction. In particular, the ratio of the high index to the low index should generally be equal to the ratio of layer 52's thickness to layer 54's thickness. The thicknesses of the layers in filter 50 are also related to the wavelengths of light that are being filtered. For example, if the layers of filter 50 are configured to each be a quarter of a wavelength in thickness at a particular wavelength, light reflection can be maximized, whereas light transmission through filter 50 can be maximized by forming layers 52 and 54 at half-wavelength thicknesses (as corrected for the respective indices of refraction in each layer). For example, an IR blocking filter with high and low indices of refraction of 2 and 1.46 has alternating thicknesses of 94 nanometers and 128 nanometers respectively.

Figure 7:
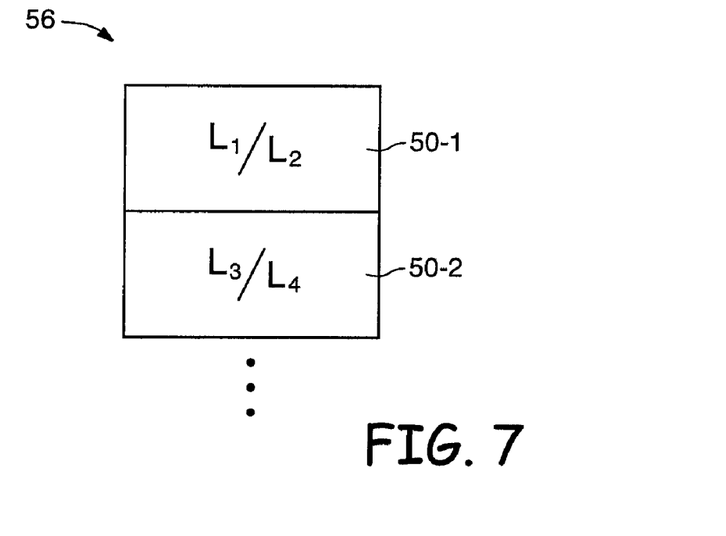
FIG. 7 is a cross-sectional side view of a double-stack multilayer interference filter in accordance with an embodiment of the present invention.

It may be possible to build a double-stack multilayer interference filter from single-stack interference filters as shown in FIG. 7. Interference filter 56 of FIG. 7 may be formed by stacking two different single-stack interference filters in series, each of which has a distinct set of high and low indices. The ratio of indices in top stack 50-1 may be different from the ratio of indices in bottom stack 50-2.

If desired, other multilayer interference structures may be formed (e.g., using different combinations of layer thicknesses and indices of refraction). The examples of FIGS. 6 and 7 are merely illustrative.

Figure 8:
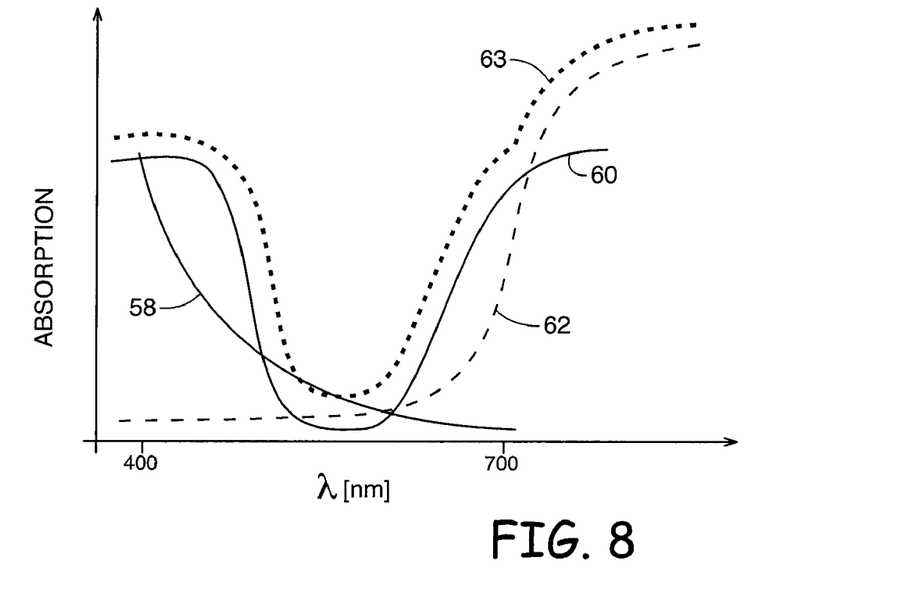
FIG. 8 is a plot showing how light absorption may vary with respect to wavelength for filter structures and bulk materials in accordance with an embodiment of the present invention.

If desired, some or all of the layers of material in a multilayer interference filter may have a non-flat absorption spectrum. FIG. 8 plots the level of absorption versus wavelength for several illustrative structures. Curve 58 shows the bulk absorption characteristic of silicon, which exhibits high levels of absorption at shorter wavelengths (i.e., near the blue portion of the spectrum). Curve 60 shows the bulk absorption characteristic of another material. The material associated with curve 60 may be, for example, a green layer that can be used to pass wavelengths near the green portion of the spectrum. With layers of alternating high and low indices, Bragg interference filter effects can be used to produce an IR block feature (curve 62).

Both bulk absorption and filtering due to the Bragg interference filter properties of a multilayer interference filter may be used together. For example, in filter 50, an IR block filter capability can be implemented using the interference filter properties of multiple high-low index layers while color band-pass filter properties can be simultaneously implemented using the bulk properties of one or both of the filter layers. Dotted line 63 corresponds to a multilayer interference filter with IR blocking (curve 62) where some of the filter layers include green band-pass material (curve 60). If desired, layers of silicon (curve 58) may be used in multilayer interference filter (e.g., to implement a filter that reduces blue light while passing green and red light).

Figure 9:
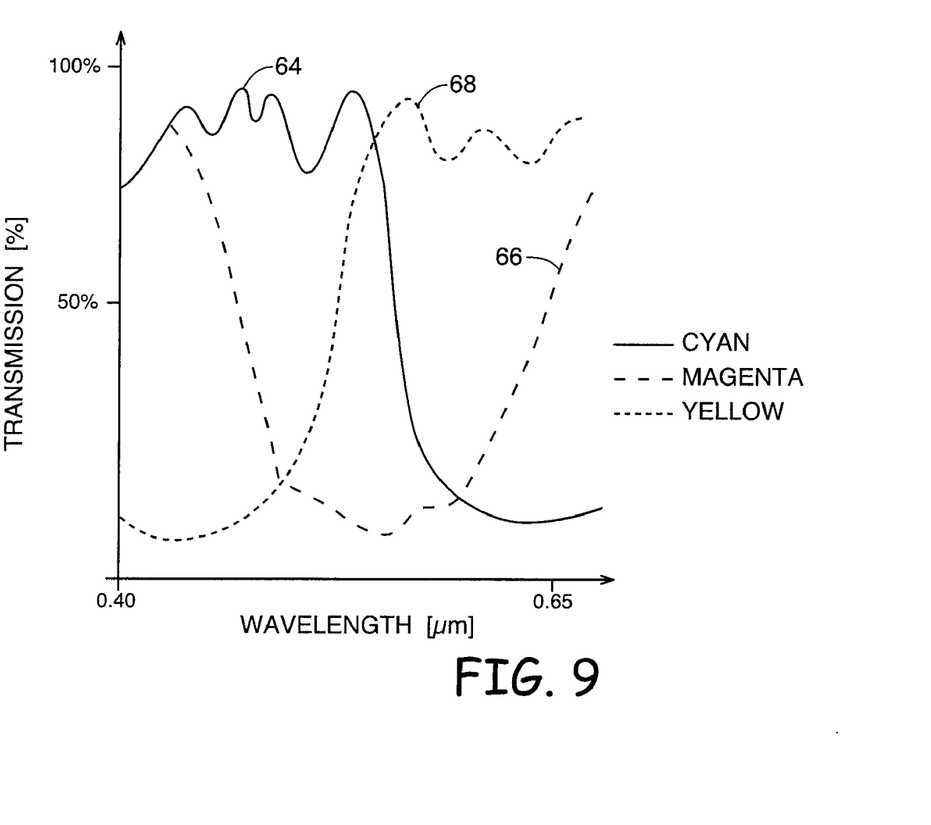
FIG. 9 is a plot showing how light transmittance may vary with respect to wavelength for multilayer interference filters in accordance with an embodiment of the present invention.

FIG. 9 shows simulated transmission characteristics of illustrative multilayer interference filters. FIG. 9 plots the level of transmission versus wavelength for filters of three different colors. Curve 64 shows the transmission characteristic of a cyan filter that passes blue and green light. Curve 66 shows the transmission characteristic of a magenta filter that passes blue and red light. Curve 68 shows the transmission characteristic of a yellow filter that passes green and red light. These three curves are examples of filters that may be used in a cyan-magenta-yellow (CMY) color filtering pattern.

Using CMY rather than conventional green-red-green-blue (GRGB) patterns can increase light collection efficiency and light sensitivity because CMY interference filters pass two colors instead of one as in the GRGB color filter array configuration.

Figure 10:
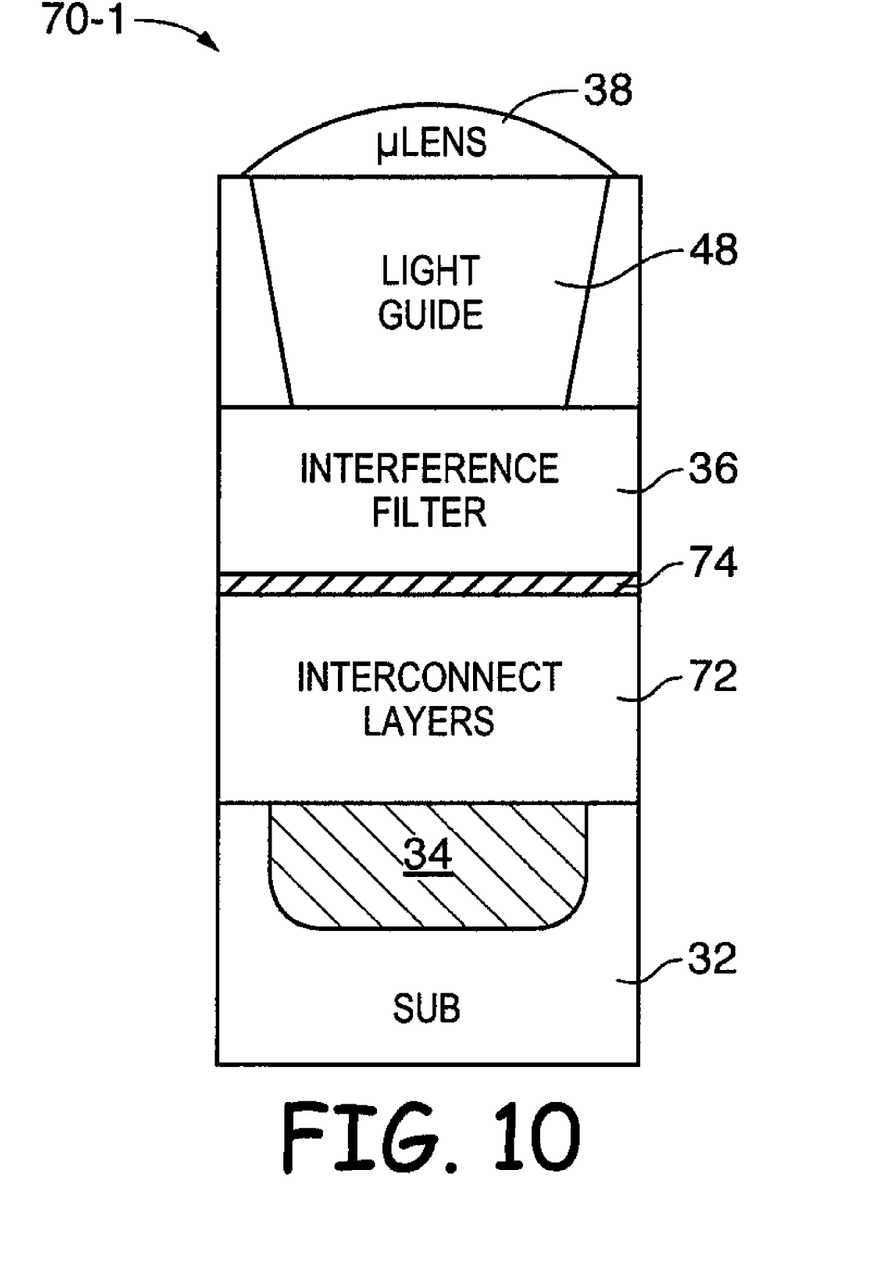
FIGS. 10, 11, and 12 are cross-sectional side views of image pixels that make up image sensors in accordance with embodiments of the present invention.

FIG. 10 shows a cross-sectional side view of a image pixel 70-1 that includes a light guide 48. Image sensor 14 (FIG. 1) includes an array of image pixels. Each image pixel has a light sensing element such as photodiode 34 on FIG. 10. Photodiode 34 is formed in substrate 32. Interconnect layers 72 may be formed on top of photodiode 34. A passivation layer 74 may be deposited on top of interconnect layers 72. Passivation layer 74 may be formed from silicon nitride or other materials that form a capping layer for interconnect layers 72.

Interference filter 36 may be formed on top of layer 74. Interference filter 36 may be constructed using a single-stack filter configuration of the type described in connection with FIG. 6, a double-stack filter configuration of the type described in connection with FIG. 7, dielectric layers of a variety of thicknesses, etc. Optional light guide 48 can be formed on filter 36. Microlens 38 may be formed on light guide 48. Microlens 38 can be formed from silicon nitride, a polymer, a glass, or other transparent materials. Microlens 38 may be formed using photolithography followed by a reflow process (as an example). Image pixel 70-1 illustrates one possible configuration for an image pixel for use in image sensor 14. Other designs may be used if desired.

Figure 11:
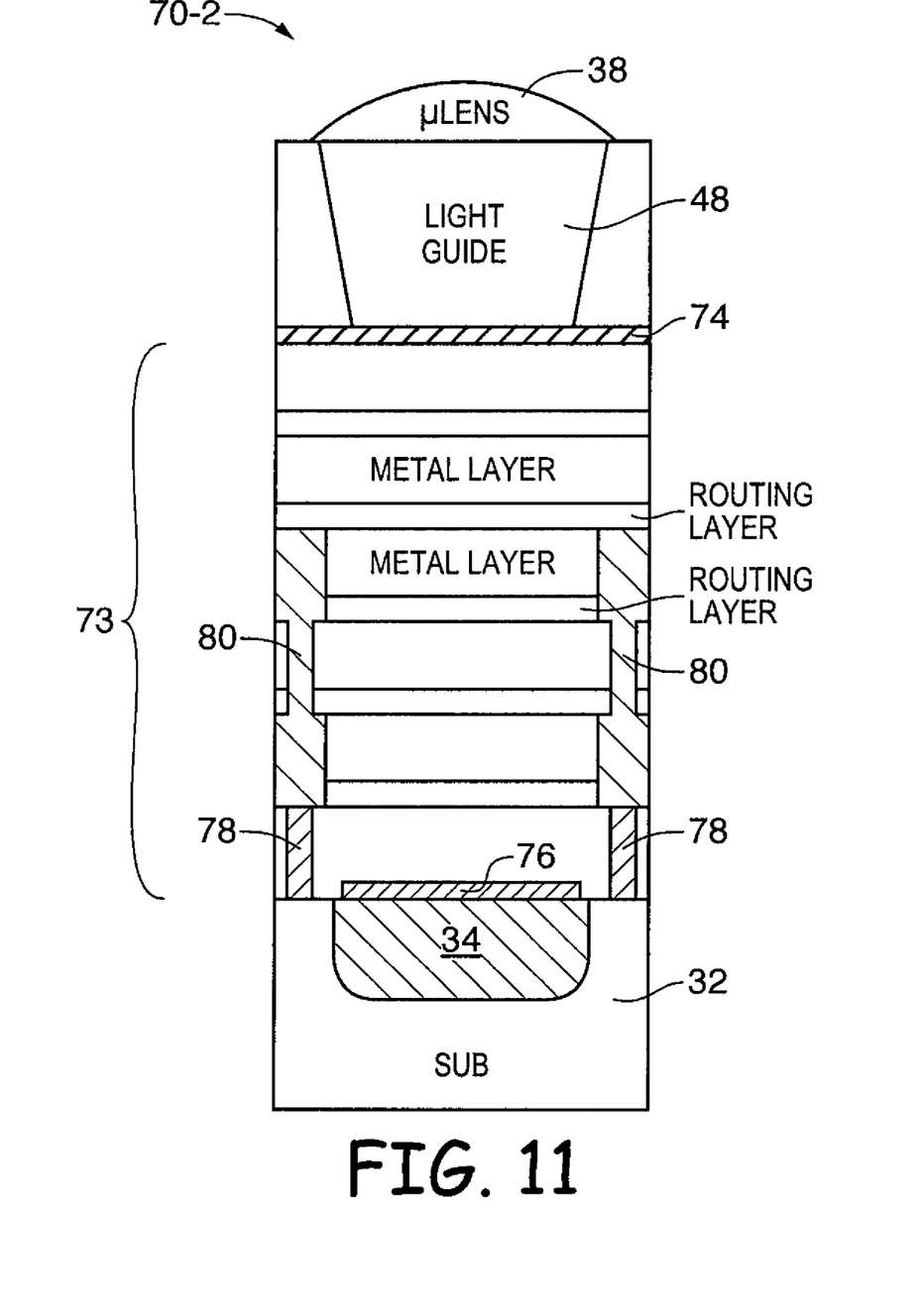

An interference filter may, if desired, be formed from the dielectric layers in an integrated circuit interconnect stack as shown in image pixel 70-2 (FIG. 11). Photodiode 34 is manufactured in substrate 32. Interconnect layers 73 may be formed on top of photodiode 34 and layer 76 may be formed between photodiode 34 and interconnect layers 72. Layer 76 may serve as an antireflection coating that reduces reflection between a potentially high index substrate (e.g., silicon) and lower index interlayer dielectric (ILD) layers. The dielectric stack of FIG. 11 may include via layers (e.g., the layer containing vias 78) and metal layers. The via layers and metal layers may be formed in an alternating pattern. The dielectric material that is used to form the dielectric stack in FIG. 11 may include silicon oxide, polymers (e.g., polyimide), spin-on glass, or other transparent dielectrics. Vias 78 can be formed from tungsten to contact with substrate 32. Vias 80 can be formed from copper.

Interconnect layers 73 may be manufactured with several layers of material having alternating high and low indices of refraction. In this way, interconnect layers 73 can simultaneously serve as an interconnect stack on an image sensor integrated circuit and as a multilayer interference filter. Interconnect layer 73 can be used as a multilayer interference filter by configuring the thicknesses and indices of refraction so that layers 73 form a Bragg-type filter structure.

Passivation layer 74 may be formed on top of interconnect layers 73. Light guide 48 may be formed on passivation layer 74. Microlens 38 may be placed on light guide 48. Microlens 38 can be formed from a transparent material such as glass, oxide, or polymer. The configuration of image pixel 70-2 is entirely CMOS compatible because dielectric interconnect layers 73 are used to form an interference filter without using colored dyes.

Figure 12:
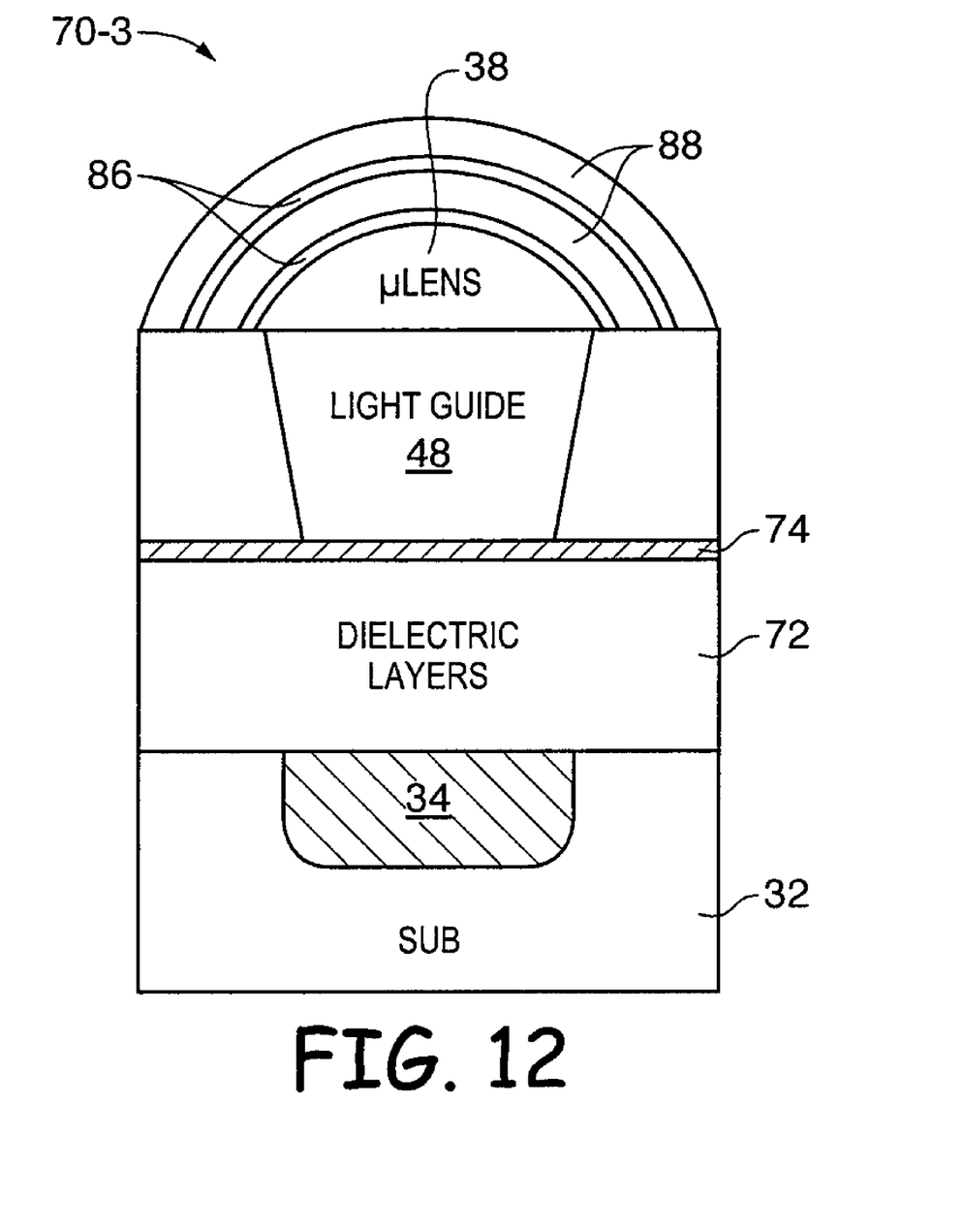

A multilayer interference filter may, if desired, be formed on top of a microlens, as shown in image pixel 70-3 (FIG. 12). An array of photodiodes such as photodiode 34 may be formed in substrate 32. A series of optional dielectric layers 72 may be formed on top of photodiode 34. Layers 72 may be dielectric interconnect layers and may, if desired, be configured to form a Bragg-type interference filter. Passivation layer 74 may be deposited on top of interconnect layers 72. Passivation layer 74 may be formed from silicon nitride (as an example).

Light guide 48 can be formed on top of passivation layer 74. Microlens 38 may be placed on top of light guide 48. Layers with alternating high and low indices may be formed on top of microlens 38. The layers of alternating high and low indices may be formed from silicon oxide, silicon nitride, silicon carbide, titanium oxide, tin oxide, hafnium oxide, zinc oxide, or other transparent material. If desired, layers 86 and 88 may be formed from spin-on coatings (e.g., spin-on glass) or may be formed from chemical vapor deposition (CVD). Physical vapor deposition (PVD) techniques may also be used in forming layers 86 and 88.

Image sensors with arrays of image pixels of the type shown in FIGS. 10-12 can be fabricated at a single CMOS plant because these pixels do not require additional (non-CMOS) processing to form dye-based color filter tiles. CMOS-based image sensors may exhibit fewer contamination issues than image sensors based on pigments or dyes. Fully CMOS-technology compatible image sensors may also provide cost savings. A CMOS image sensor can be fabricated in one fabrication plant and need not be transferred to another facility for color filter array and microlens processing. The dielectric elements of pixels in CMOS image sensors may also be able to withstand sun exposure and high temperatures better than optical elements based on organic materials commonly used in conventional dye-based filters.

Image sensors with multilayer interference filters may be formed that handle one color of light. Monochrome sensors such as these may have image pixels that each have the same type of multilayer interference filter. A monochrome sensor may be used in a device of the type shown in FIG. 4. For example, image sensors 14-R, 14-G, and 14-B may each be monochrome image sensors.

Image sensors with multilayer interference filters may also be formed in which the pixels are associated with multiple colors (e.g., using a Bayer pattern). In this type of image sensor, red pixels have multilayer interference filters that pass red light, blue pixels have interference filters that pass blue light, and green pixels have interference filters that pass green light. Photolithographic techniques may be used to form image pixel interference filters of different colors.

Various embodiments have been described illustrating image sensors with multilayer interference filters. An image sensor may be provided for use in electronic devices with imaging capabilities. Unlike conventional image sensors that require processing at a CMOS plant and additional processing at a color filtering array (CFA) plant, the image sensor may, if desired, be fabricated at a single CMOS fabrication facility. The image sensor may exhibit increased efficiency, increased sensitivity, increased tolerance to contamination, and reduced cost.

The image sensor may incorporate layers of material with alternating high and low indices of refraction. In this way, multilayer interference filters may be created to pass desired wavelengths of light to underlying photodiodes in associated image pixels.

The image sensors may include components such as microlenses and light guides to focus incoming light. The multilayer interference filters may be placed below or above the microlenses to provide color filtering or infrared (IR) blocking.

In situations in which an interference filter is placed below a microlens, the interference filter may be integrated directly into interconnect layers, taking advantage of the alternating structure of dielectric layers available among the interconnect layers in a CMOS integrated circuit. The interference filter can also be placed above the interconnect layers.

In situations in which an interference filter is placed above a microlens, the interference filter may be formed by spin coating, by chemical vapor deposition, or by physical vapor deposition.

Regardless of where an interference filter is formed, the interference filter may be tuned to filter out desired wavelengths in the visible spectrum (e.g., to form a color filter) and to filter out undesirable infrared (IR) wavelengths (e.g., to form an IR blocking filter). Image sensors incorporating interference filters can include image pixels that pass a variety of colors. Pixel colors can include red, green, blue, cyan, magenta, or yellow, depending on the type of image sensor pattern to be implemented.

The foregoing is merely illustrative of the principles of this invention which can be practice in other embodiments.

What is claimed is:

1. An image sensor comprising:
   a substrate;
   a photodiode fabricated in the substrate; and
   a color filter formed on the substrate over the photodiode, wherein the color filter includes alternating metal layers and via layers that have respective high and low indices of refraction and that provide routing interconnections for the image sensor.

2. The image sensor defined in claim 1, wherein the metal layers and via layers comprise alternating interconnect layers, wherein the alternating interconnect layers have first and second respective alternating thicknesses, and wherein the ratio of the second thickness to the first thickness is equal to the ratio of the high index of refraction to the low index of refraction.

3. The image sensor defined in claim 1, wherein the metal layers and via layers comprise alternating interconnect layers, wherein there are fewer than 10 alternating interconnect layers, wherein the indices of refraction have values between 1.0 and 6.0, and wherein the thickness of each layer is less than 200 nanometers.

4. The image sensor defined in claim 1 further comprising a silicon nitride layer formed on the color filter.

5. The image sensor defined in claim 1 further comprising:
   a microlenses; and a light guide between the microlens and the color filter, wherein the light guide has a higher index of refraction than surrounding dielectric.

6. The image sensor defined in claim 1 further comprising a microlens formed on the substrate above the color filter.

7. An array of image pixels formed on a substrate, comprising:
an array of photodiodes formed in the substrate, wherein each photodiode is associated with a respective one of the image pixels;
an array of microlenses on the substrate, wherein each microlens is associated with a respective one of the image pixels;
a color filter array formed on the substrate between the array of photodiodes and the array of microlenses, wherein the color filter array includes alternating metal layers and via layers that have respective high and low indices of refraction and that provide routing interconnections for the array of image pixels; and
a multilayer interference filter formed above the array of microlenses, wherein the multilayer interference filter is operable to pass at least red light, green light, and blue light to each image pixel.

8. The array of image pixels defined in claim 7 wherein the color filter array includes infrared-blocking band-pass filters.

9. The array of image pixels defined in claim 7 wherein the color filter array includes band-pass filters and wherein each of the band-pass filters pass light of a color selected from a group including: red, blue, green, magenta, cyan, and yellow.

10. The array of image pixels defined in claim 7 wherein the color filter array comprises a multicolor color filter array for the array of image pixels.

11. An array of image pixels formed on a substrate, comprising:
an array of photodiodes formed in the substrate, wherein each photodiode is associated with a respective one of the image pixels;
an array of microlenses on the substrate, wherein each microlens is associated with a respective one of the image pixels;
an array of multilayer interference filters each of which is associated with a respective one of the microlenses, wherein the multilayer interference filters each comprise alternating metal layers and via layers that have respective high and low indices of refraction and that provide routing interconnections for the array of image pixels, wherein the multilayer interference filters are configured to form a monochrome image sensor filter and wherein all the photodiodes in the array of image pixels form part of a monochrome image sensor and receive light of the same color through the monochrome image sensor filter.

12. The array of image pixels defined in claim 7 wherein the color filter array includes at least some filters that have a non-flat light absorption spectrum that influences which wavelengths of light pass through the at least some filters.

13. An image sensor comprising:
an array of photodiodes fabricated in a substrate;
an array of microlenses corresponding to the array of photodiodes;
a color filter array formed on the substrate between the array of photodiodes and the array of microlenses, wherein the color filter array includes alternating metal layers and via layers that have respective high and low indices of refraction and that provide routing interconnections for the image sensor; and
light guides interposed between the microlenses and the color filter array, wherein the light guides have higher indices of refraction than surrounding dielectric, and wherein the light guides are formed immediately below and adjacent to the microlenses.

14. The image sensor defined in claim 13, wherein the color filter array includes band-pass filters for first, second, and third colors and are arranged in a multicolor color filter array pattern.

15. The image sensor defined in claim 13 wherein the color filter array includes band-pass filters that are arranged in a Bayer-pattern color filter array.

16. The image sensor defined in claim 13 wherein the color filter array includes filters of different colors and are arranged to form a color filter array for the image sensor.

17. The image sensor defined in claim 13, wherein the color filter array includes glass layers.

18. The image sensor defined in claim 13 wherein the color filter array includes band-pass Bragg filters.

19. An array of image pixels formed on a substrate, comprising:
an array of photodiodes formed in the substrate, wherein each photodiode is associated with a respective one of the image pixels;
an array of microlenses on the substrate, wherein each microlens is associated with a respective one of the image pixels;
an array of multilayer interference filters each of which is associated with a respective one of the microlenses, wherein the array of image pixels comprises a monochromic array of image pixels, wherein the multilayer interference filters each comprise alternating metal layers and via layers that have respective high and low indices of refraction and that provide routing interconnections for the array of image pixels, wherein the multilayer interference filters are configured to form a monochrome image sensor filter and wherein all the photodiodes in the array of image pixels form part of a monochrome image sensor and receive a selected one of red light, blue light, and green light through the monochrome image sensor filter.

* * * * *